(12) United States Patent
Do et al.

(10) Patent No.: US 8,026,127 B2
(45) Date of Patent: Sep. 27, 2011

(54) INTEGRATED CIRCUIT PACKAGE SYSTEM WITH SLOTTED DIE PADDLE AND METHOD OF MANUFACTURE THEREOF

(75) Inventors: Byung Tai Do, Singapore (SG); Linda Pei Ee Chua, Singapore (SG)

(73) Assignee: Stats Chippac Ltd., Singapore (SG)

(*) Notice: Subject to any disclaimer, the term of this patent is extended or adjusted under 35 U.S.C. 154(b) by 82 days.

(21) Appl. No.: 12/467,133

(22) Filed: May 15, 2009

(65) Prior Publication Data

US 2009/0283893 A1 Nov. 19, 2009

Related U.S. Application Data

(60) Provisional application No. 61/053,664, filed on May 16, 2008.

(51) Int. Cl.
*H01L 21/00* (2006.01)

(52) U.S. Cl. .......... 438/106; 438/26; 438/111; 438/123; 257/E23.003; 257/E23.141; 257/E21.499

(58) Field of Classification Search .......... 438/26, 438/106, 111, 123; 257/E23.003, E23.141, 257/E21.499
See application file for complete search history.

(56) References Cited

U.S. PATENT DOCUMENTS

| | | | | |
|---|---|---|---|---|
| 5,994,222 | A | * | 11/1999 | Smith et al. .......... 438/689 |
| 6,448,633 | B1 | | 9/2002 | Yee et al. |
| 6,531,335 | B1 | * | 3/2003 | Grigg .......... 438/106 |
| 2007/0114650 | A1 | | 5/2007 | Punzalan et al. |
| 2008/0006929 | A1 | | 1/2008 | Punzalan et al. |
| 2009/0065914 | A1 | | 3/2009 | Engl et al. |
| 2009/0068799 | A1 | | 3/2009 | Shen et al. |

* cited by examiner

*Primary Examiner* — Michelle Estrada
(74) *Attorney, Agent, or Firm* — Mikio Ishimaru

(57) ABSTRACT

A method of manufacture of an integrated circuit package system including: providing a selective slot die paddle having selective slots and edge pieces around the perimeter; providing extended leads protruding into the selective slots; mounting an integrated circuit die on the selective slot die paddle; and coupling bond wires between the integrated circuit die, the edge pieces, the extended leads, or a combination thereof.

20 Claims, 4 Drawing Sheets

INTEGRATED CIRCUIT PACKAGE SYSTEM WITH SLOTTED DIE PADDLE AND METHOD OF MANUFACTURE THEREOF

CROSS-REFERENCE TO RELATED APPLICATION

This application claims the benefit of U.S. Provisional Patent Application Ser. No. 61/053,664 filed May 16, 2008, and the subject matter thereof is incorporated herein by reference thereto.

TECHNICAL FIELD

The present invention relates generally to integrated circuit package system and more particularly to an integrated circuit package system having no leads.

BACKGROUND ART

Modern consumer electronics, such as smart phones, personal digital assistants, and location based services devices, as well as enterprise electronics, such as servers and storage arrays, are packing more semiconductor die into an ever-shrinking physical space with expectations for decreasing cost.

Every new generation of semiconductor die with increased operating frequency, performance, and higher level of large-scale integration has underscored the need for back-end semiconductor manufacturing to provide more solutions. Numerous technologies have been developed to meet these requirements. Some of the research and development strategies focus on new package technologies while others focus on improving the existing and mature package technologies.

Integrated circuit package structures continue to advance toward miniaturization to increase the density of the components that are packaged in them while decreasing the sizes of the products that are made using the packages. This is in response to continually increasing demands on information and communication apparatus for ever-reduced sizes, thicknesses, and costs along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook personal computers, and so forth. All of these devices continue to be made smaller and smaller to improve their portability. Accordingly, large-scale IC ("LSI") packages that are incorporated into these devices are required to be made smaller. The package configurations that house and protect LSI require them to be made smaller as well.

Many conventional integrated circuit packages are of the type where a semiconductor die is molded into a package with a resin, such as an epoxy molding compound. The packages have a lead frame whose leads are projected from the package body, to provide a path for signal transfer between the die and external devices. Other conventional package configurations have contact terminals or pads formed directly on the surface of the package.

Such a conventional integrated circuit package is fabricated through the following processes: a die-bonding process (mounting the semiconductor die onto the paddle of a lead frame), a wire-bonding process (electrically connecting the semiconductor die on the paddle to inner leads using bond wires), a molding process (encapsulating a predetermined portion of the assembly, containing the die, inner leads and lead frame wires, with an epoxy resin to form a package body), and a trimming process (completing each assembly as individual, independent packages).

The integrated circuit packages, thus manufactured, are then mounted by matching and soldering the external leads or contact pads to a matching pattern on a circuit board, to thereby enable power and signal input/output ("I/O") operations between the semiconductor devices in the packages and the circuit board.

An exemplary integrated circuit package, well known in the electronics industry, is the quad flat nonleaded ("QFN") package. QFN packages typically include a lead frame, such as a conductive sheet stamped and etched, with a semiconductor die having a multitude of bond pads mounted to the top side of the lead frame. Bond wires electrically connect the bond pads of the semiconductor die to a series of conductive lead fingers on the topside of the lead frame. Typically, the semiconductor die and the bond wires are encapsulated within a molding compound.

In order to reduce manufacturing costs, the electronics industry is increasing the usage of QFN packages. In the manufacturing process, many obstacles must be overcome to deliver extremely small packages with small horizontal dimensions in high volume. Despite the trend towards miniaturization, more functions and more semiconductor die continue to be packed into QFN packages. Typical QFN solutions face problems providing the high density and high count I/O needed for modern electronic products.

Thus, a need still remains for an integrated circuit package system providing low cost manufacturing, improved yield, improved reliability, and high density I/O count. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit package system including: providing a selective slot die paddle having selective slots and edge pieces around the perimeter; providing extended leads protruding into the selective slots; mounting an integrated circuit die on the selective slot die paddle; and coupling bond wires between the integrated circuit die, the edge pieces, the extended leads, or a combination thereof.

The present invention provides an integrated circuit package system including: a selective slot die paddle having selective slots and edge pieces around the perimeter; extended leads protruding into the selective slots; an integrated circuit die mounted on the selective slot die paddle; and bond wires coupled between the integrated circuit die, the edge pieces, the extended leads, or a combination thereof.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
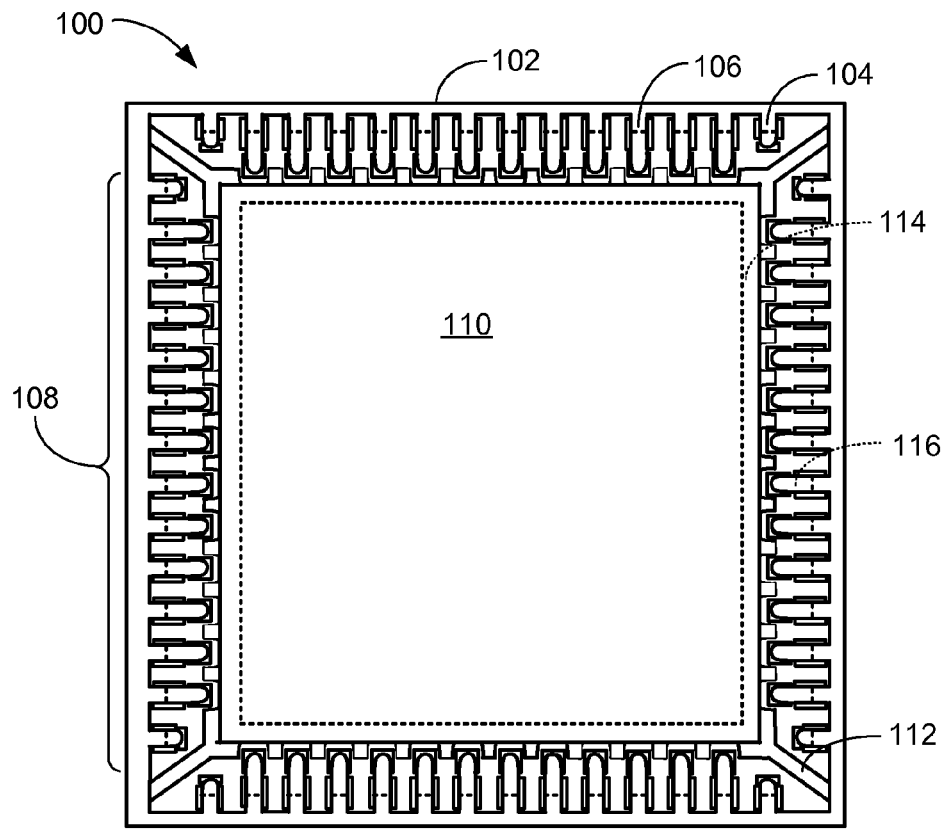
FIG. 1 is a bottom plan view of an integrated circuit package system with slotted die pad, in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGS. is arbitrary for the most part. Generally, the invention can be operated in any orientation.

Where multiple embodiments are disclosed and described, having some features in common, for clarity and ease of illustration, description, and comprehension thereof, similar and like features one to another will ordinarily be described with similar reference numerals.

For expository purposes, the term "horizontal" as used herein is defined as a plane parallel to the plane or surface of the die paddle, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, and/or removal of the material or photoresist as required in forming a described structure.

Referring now to FIG. 1, therein is shown a bottom plan view of an integrated circuit package system 100 with slotted die pad, in an embodiment of the present invention. The top view of the integrated circuit package system 100 depicts a lead frame 102, such as a copper, tin, nickel, or alloy lead frame, having leads 104 and extended leads 106 in an array 108 around a selective slot die paddle 110.

The leads 104 are formed by stamping from the metal sheet used to form the lead frame 102. The leads 104 are of a customary length and width except for some special features described later.

The extended leads 106 are formed as the leads 104 are formed. The extended leads 106 may be longer than the length of the leads 104, as required by the individual lead frame 102 application.

The selective slot die paddle 110 may be of a rectangular shape and having a special edge feature, as described below, formed on the perimeter of the rectangular shape. The perimeter of the selective slot die paddle 110 may be half etched on approximately 1.0 mm of the outside bottom surface.

The array 108 of the leads 104 and the extended leads 106 is shown as a single row but this is an example only. The actual implementation may have multiple rows of the leads 104 and the extended leads 106 as is known in quad flat pack no-lead (QFN) packaging systems.

The lead frame 102 may have tie bars 112 for suspending the selective slot die paddle 110, the leads 104 and the extended leads 106. The tie bars 112 and portions of the selective slot die paddle 110 may be half etched to remove a bottom portion by chemical or mechanical means.

A plated region 114, of the selective slot die paddle 110, may be coated with a metal, including gold, copper, nickel, or an alloy thereof. A plated lead region 116 may also be coated with the metal. The metal may be deposited on the plated region 114 and the plated lead region 116 by electroplating or sputtering in order to improve the bond wire (not shown) adhesion.

Figure 2:
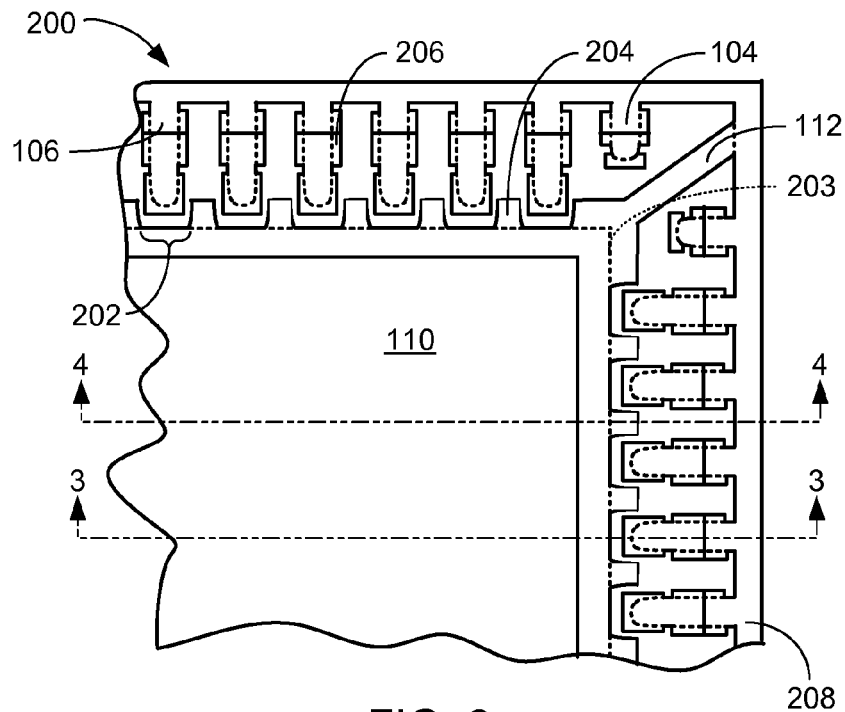
FIG. 2 is an enlarged top plan view of a portion of the lead frame of FIG. 1.

Referring now to FIG. 2, therein is shown an enlarged top plan view of a portion 200 of the lead frame 102 of FIG. 1. The enlarged top plan view of the portion 200 depicts selective slots 202, as the special edge feature, formed in the perimeter of the selective slot die paddle 110.

The selective slots 202 may be of a rectangular shape with corner radius for rounded edge features. The selective slots 202 may extend from the outside edge of the selective slot die paddle 110 to a half etched edge 203, approximately 1.0 mm. The shape of the selective slots 202 is an example only and other shapes are possible. The selective slot 202 is so named because the slot formed in the edge may be in any position or omitted from around the perimeter of the selective slot die paddle 110 as required by the application.

Edge pieces 204 may be the remaining half etched area between the selective slots 202. The half etching process allows wider clearances on the package bottom (not shown) in order to facilitate a more reliable manufacturing process at the printed circuit board (PCB) level and defines the limits of the edge pieces 204.

The selective slot die paddle 110 is so named because any number and spacing of the selective slots 202 may be formed in the perimeter based on the requirement of the integrated circuit application. The number and position of the selective slots 202 on the selective slot die paddle 110 is an example only and the actual number and spacing may differ. The dimension of the edge pieces 204 may be fixed by design guidelines. A typical spacing between the selective slots 202 and the end of the extended leads 106 may be 0.5 mm while the edge pieces 204 may extend 1.0 mm from the end of the selective slot 202, as shown in FIG. 2.

Each of the leads 104 and the extended leads 106 may have lead locking features 206 on their peripheries. The lead locking features 206 may be half etched in order to provide a smaller size of the leads 104 and the extended leads 106 in the finished package (not shown).

The lead locking feature 206 may be portions of the leads 104 and extended leads 106 that extend laterally out from the tops of the lead fingers to allow mold compound underneath the lead fingers so the solidified mold compound is held from delaminating from the lead fingers.

Figure 3:
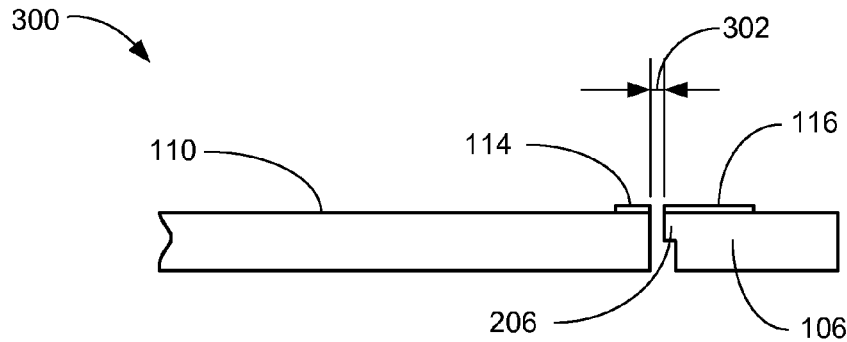
FIG. 3 is a cross-sectional view of a portion taken along line 3-3 of FIG. 2.

A line 3-3 drawn through the extended lead 106 having the lead locking features 206 shows the position of segmentation and the direction of view for the structure of FIG. 3. A line 4-4 drawn through the edge piece 204 shows the position of segmentation and the direction of view for the structure of FIG. 4.

The tie bar 112 is shown to be half etched with a boundary at the selective slot die paddle 110. Lead support struts 208 may remain at full thickness as they will be removed during the singulation process.

Referring now to FIG. 3, therein is shown a cross-sectional view of a portion 300 taken along line 3-3 of FIG. 2. The cross-sectional view of the portion 300 depicts the selective slot die paddle 110 having the plated region 114. The extended lead 106 may have the plated lead region 116 on the lead locking feature 206 and the extended lead 106.

A gap 302 may be on the order of 0.5 mm between the lead locking feature 206 and the selective slot die paddle 110. Wire bonding on half etch leads (the current practice) may lead to potential bouncing of the lead fingers (not shown) and generate lower manufacturing yields.

It has been discovered that bonding on the extended leads 106 can eliminate this problem. The half etch processing on the lead locking feature 206 is not significant enough to induce lead bouncing during the wire bond process.

Figure 4:
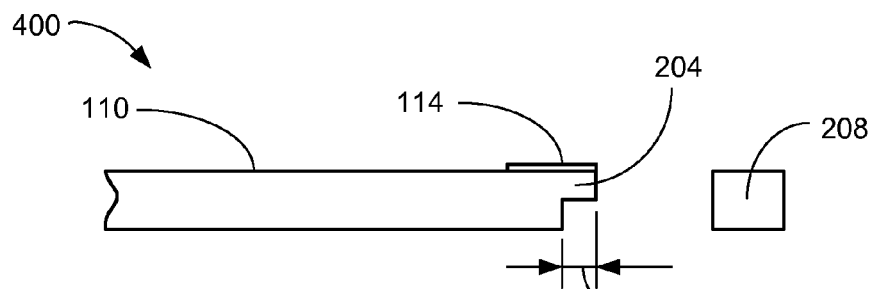
FIG. 4 is a cross-sectional view of a portion taken along line 4-4 of FIG. 2.

Referring now to FIG. 4, therein is shown a cross-sectional view of a portion 400 taken along line 4-4 of FIG. 2. The cross-sectional view of the portion 400 depicts the selective slot die paddle 110 having the plated region 114 that may extend over the edge piece 204.

An extension 402 may be on the order of 1.0 mm in length and equal to the distance that the edge piece 204 extends beyond the selective slot die paddle 110. The material of the plated region 114 may provide additional support to prevent any potential bouncing of the edge pieces 204 during the bonding process.

Figure 5:
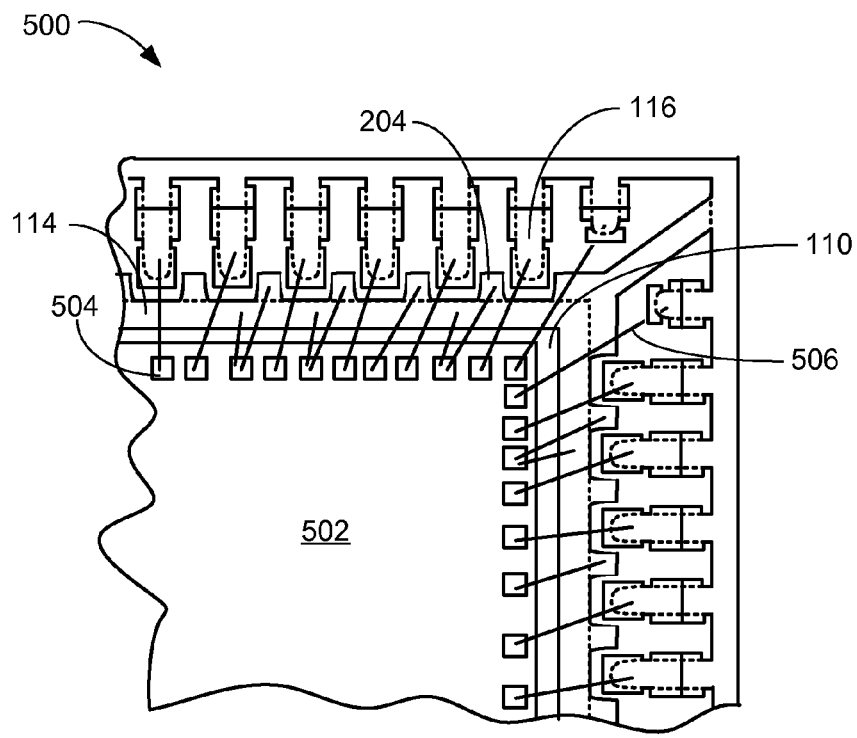
FIG. 5 is a top plan view of a portion of an integrated circuit package system in a first embodiment of the present invention.

Referring now to FIG. 5, therein is shown a top plan view of a portion 500 of the integrated circuit package system 100 in a first embodiment of the present invention. The top plan view of the portion 500 depicts an integrated circuit die 502, such as a wire bond integrated circuit, having bond pads 504 positioned near the edge. While the figure shows only single rows of the bond pads 504, this is an example only and multiple rows of the bond pads 504 is possible.

The plated region 114 may surround the integrated circuit die 502 in order to provide an advantageous bonding surface for attaching bond wires 506, such as gold wires, aluminum wires, alloy wires or the like, between the bond pads 504, the edge pieces 204, the extended leads 106, the leads 104, or a combination thereof. The plated lead region 116 may also provide an advantageous bonding surface for attaching the bond wires 506.

Embodiments of the present invention provide the selective slot die paddle 110 and the extended leads 106 for a QFN package (not shown). The extended leads 106 help to reduce the bond wire 506 length by an estimation of 0.2 mm min. per wire interconnect, resulting in substantial cost saving on gold wire. By reducing the length of the wires, they are less susceptible to being pushed together during the molding process thus providing an improvement on the wire sweep performance.

Wire bonding on half etch leads (the current practice) may lead to potential bouncing of the lead fingers and lower yields. It has been discovered that bonding on the extended leads 106 can eliminate this problem. This further helps in improving wire bonding process yield and stability.

Figure 6:
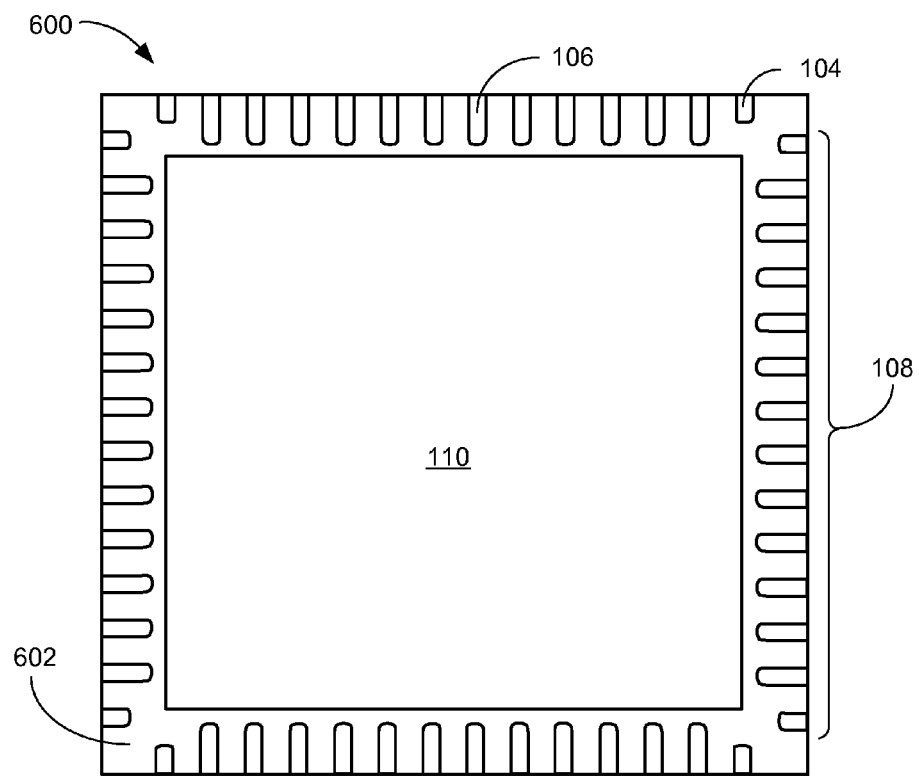
FIG. 6 is a bottom view of a singulated quad flat pack no-lead (QFN) package having the structure of FIG. 5.

Referring now to FIG. 6, therein is shown a bottom view of a singulated quad flat pack no-lead (QFN) package 600 having the structure of FIG. 5. The bottom view of the singulated quad flat pack no-lead (QFN) package 600 depicts the bottom surface of the selective slot die paddle 110, the leads 104 and the extended leads 106 sealed in a molding compound 602, such as an epoxy molding compound. The molding compound 602, the leads 104, the extended leads 106 and the selective slot die paddle 110 form a single planar surface.

The array 108 of the leads 104 and the extended leads 106 are shown as a single row, but it is understood that this is an example only. It is likely that the array 108 would include multiple rows of the leads 104 and the extended leads 106.

Figure 7:
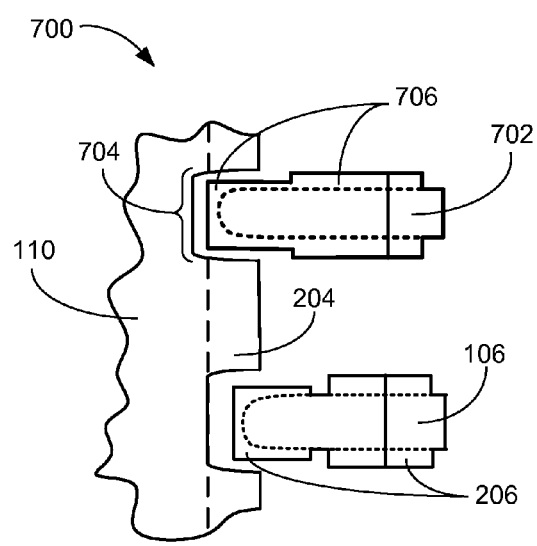
FIG. 7 is a top plan view of a comparison of the extended lead and a second extended lead in an alternate embodiment of the present invention.

Referring now to FIG. 7, therein is shown a top plan view of a comparison 700 of the extended lead 106 and a second extended lead 702 in an alternate embodiment of the present invention. The top plan view of the comparison 700 depicts the extended lead 106 as previously described and the second extended lead 702 which may be longer than the extended lead 106 by 0.5 mm to 1.0 mm.

The second extended lead 702 may include a lead locking feature 706 made of multiple rectangular regions that have been half etched around the bottom portion of the second extended lead 702.

In order to accommodate the longer length of the second extended lead, a deep selective slot 704 may be required which extends deeper into the selective slot die paddle 110. The deep selective slot 704 may extend into the selective slot die paddle 110 beyond the half etched edge 203 of the edge pieces 204. This additional recess would be visible on the package bottom (not shown).

The lead locking feature 206 of the extended lead 106 may only partially enclose the extended lead 106. The lead locking feature 706 of the second extended lead 702 may completely surround the upper surface of the second extended lead 702.

The additional length of the second extended lead 702 may allow additional reduction in the length of the bond wires 506, of FIG. 5. By using less length of the bond wires 506, material costs may be reduced and manufacturing yield may increase.

Figure 8:
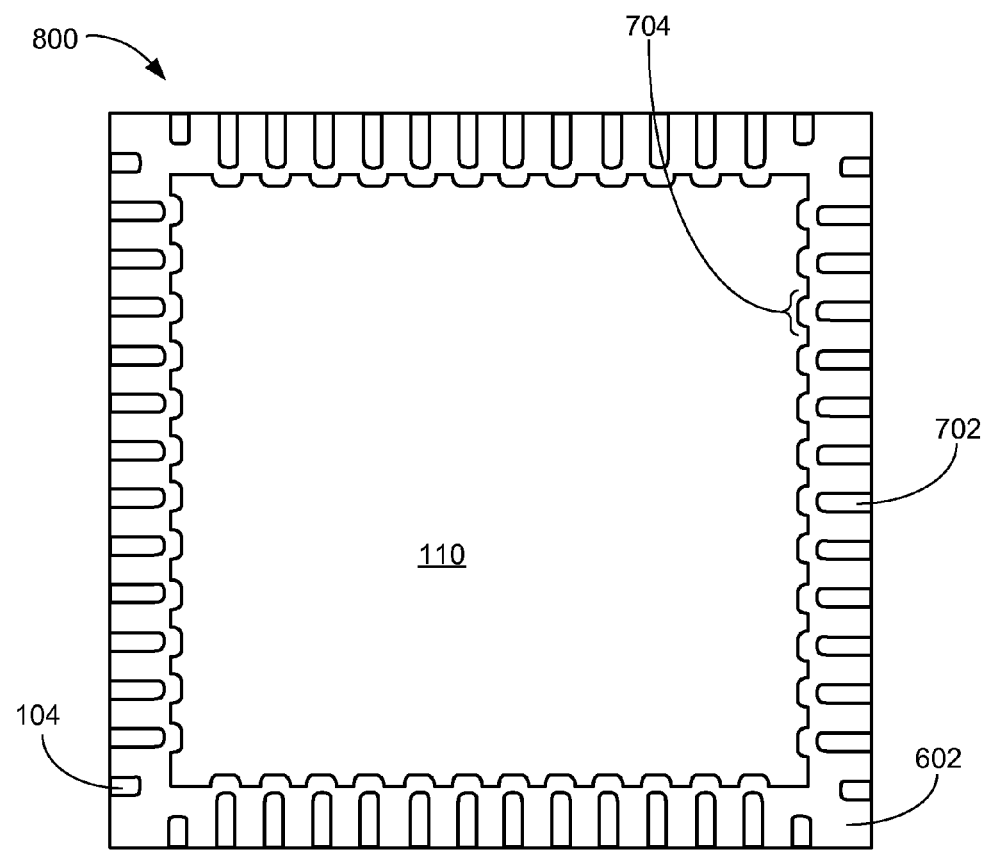
FIG. 8 is a bottom view of a singulated QFN package having the structure of FIG. 5 having extended leads of the alternate embodiment.

Referring now to FIG. 8, therein is shown a bottom view of a singulated QFN package 800 having the structure of FIG. 5 with the second extended leads 702 of the alternate embodiment. The bottom view of the singulated QFN package 800 depicts the selective slot die paddle 110 having the deep selective slot 704. The second extended leads 702 are formed around the edges of the selective slot die paddle 110.

The configuration of the selective slot die paddle 110 is shown having only the leads 104 and the second extended leads 702, but this is an example only and the actual configuration may have a mixture of the leads 104, the extended leads 106, of FIG. 1, and the second extended leads 702 as required by the application.

The molding compound 602 may form a planar surface with the selective slot die paddle 110, the leads 104, and the second extended leads 702. The number, size and spacing of the second extended leads 702 is an example only and the actual number and spacing may differ.

Thus, it has been discovered that the integrated circuit package system and device of the present invention furnishes important and heretofore unknown and unavailable solutions, capabilities, and functional aspects for manufacturing integrated circuit QFN packages.

Figure 9:
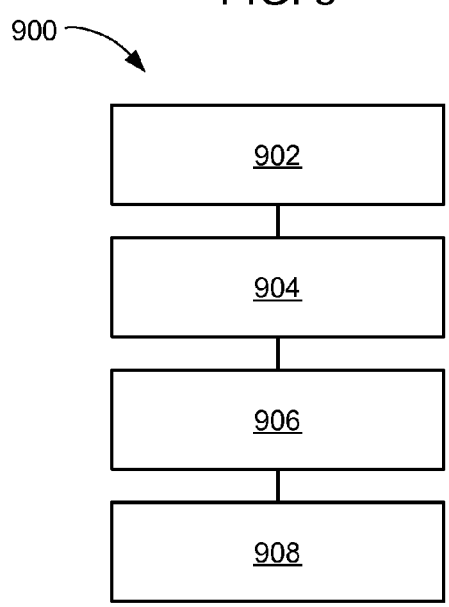
FIG. 9 is a flow chart of a method of manufacture of an integrated circuit package system in an embodiment of the present invention.

Referring now to FIG. 9, therein is shown a flow chart of a method 900 of manufacture of the integrated circuit package system 100 in an embodiment of the present invention. The method 900 includes: providing a selective slot die paddle having selective slots and edge pieces around the perimeter in a block 902; providing extended leads protruding into the selective slots in a block 904; mounting an integrated circuit die on the selective slot die paddle in a block 906; and coupling bond wires between the integrated circuit die, the edge pieces, the extended leads, or a combination thereof in a block 908.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit QFN package systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit package system comprising:
   providing a selective slot die paddle having selective slots and edge pieces around the perimeter including half etching a tie bar for supporting the selective slot die paddle;
   providing extended leads protruding into the selective slots;
   mounting an integrated circuit die on the selective slot die paddle; and
   coupling bond wires between the integrated circuit die, the edge pieces, the extended leads, or a combination thereof.

2. The method as claimed in claim 1 further comprising forming a plated region on the selective slot die paddle.

3. The method as claimed in claim 1 further comprising:
   forming a plated lead region on the surface of the extended leads; and
   providing a lead locking feature on the edges of the extended lead.

4. The method as claimed in claim 1 further comprising forming a molding compound on the selective slot die paddle, the integrated circuit die, the bond wires, and the extended leads.

5. The method as claimed in claim 1 further comprising:
   forming a deep selective slot in the selective slot die paddle; and
   providing a second extended lead protruding into the deep selective slot.

6. A method of manufacture of an integrated circuit package system comprising:
   providing a selective slot die paddle having selective slots and edge pieces around the perimeter including half etching a tie bar for supporting the selective slot die paddle;
   providing extended leads protruding into the selective slots including providing leads adjacent to the extended leads;
   mounting an integrated circuit die on the selective slot die paddle including aligning pads with the extended leads; and
   coupling bond wires between the integrated circuit die, the edge pieces, the extended leads, or a combination thereof including coupling the pads to the leads.

7. The method as claimed in claim 6 further comprising forming a plated region on the selective slot die paddle including depositing a metal in the plated region.

8. The method as claimed in claim 6 further comprising:
   forming a plated lead region on the surface of the extended leads including depositing a metal on the leads and the extended leads; and
   providing a lead locking feature on the edges of the extended lead including surrounding a second extended lead by the lead locking feature.

9. The method as claimed in claim 6 further comprising forming a molding compound on the selective slot die paddle, the integrated circuit die, the bond wires, and the extended leads including forming a planar surface including the leads, the extended leads, the selective slot die paddle, by the molding compound.

10. The method as claimed in claim 6 further comprising:
    forming a deep selective slot in the selective slot die paddle wherein forming the deep selective slot includes a recess in the selective slot die paddle, beyond a half etched edge; and
    providing a second extended lead protruding into the deep selective slot.

11. An integrated circuit package system comprising:
    a selective slot die paddle having selective slots and edge pieces around the perimeter includes a tie bar, half etched, for supporting the selective slot die paddle;
    extended leads protruding into the selective slots;
    an integrated circuit die mounted on the selective slot die paddle; and
    bond wires coupled between the integrated circuit die, the edge pieces, the extended leads, or a combination thereof.

12. The system as claimed in claim 11 further comprising a plated region on the selective slot die paddle.

13. The system as claimed in claim 11 further comprising:
    a plated lead region on the surface of the extended leads; and
    a lead locking feature on the edges of the extended lead.

14. The system as claimed in claim 11 further comprising a molding compound formed on the selective slot die paddle, the integrated circuit die, the bond wires, and the extended leads.

15. The system as claimed in claim 11 further comprising:
a deep selective slot in the selective slot die paddle; and
a second extended lead protruding into the deep selective slot.

16. The system as claimed in claim 11 further comprising:
a tie bar for supporting the selective slot die paddle;
leads adjacent to the extended leads; and
pads aligned with the extended leads and coupled by the bond wires.

17. The system as claimed in claim 16 further comprising a plated region on the selective slot die paddle including a metal deposited in the plated region.

18. The system as claimed in claim 16 further comprising:
a plated lead region on the surface of the extended leads includes a metal deposited on the leads and the extended leads; and
a lead locking feature on the edges of the extended lead includes a second extended lead surrounded by the lead locking feature.

19. The system as claimed in claim 16 further comprising a molding compound formed on the selective slot die paddle, the integrated circuit die, the bond wires, and the extended leads includes a planar surface including the leads, the extended leads, the selective slot die paddle, by the molding compound.

20. The system as claimed in claim 16 further comprising:
a deep selective slot in the selective slot die paddle wherein the deep selective slot includes a recess in the selective slot die paddle beyond a half etched edge; and
a second extended lead protruding into the deep selective slot.

* * * * *

UNITED STATES PATENT AND TRADEMARK OFFICE
CERTIFICATE OF CORRECTION

PATENT NO. : 8,026,127 B2  
APPLICATION NO. : 12/467133  
DATED : September 27, 2011  
INVENTOR(S) : Do et al.

Page 1 of 1

It is certified that error appears in the above-identified patent and that said Letters Patent is hereby corrected as shown below:

Column 3:
line 12, add double dashes between numbers 3-3 as follows: delete "line 3-3 of FIG. 2." and insert therefor --line 3--3 of FIG. 2.-- line 15, add double dashes between numbers 4-4 as follows: delete "line 4-4 of FIG. 2." and insert therefor --line 4--4 of FIG. 2.-- line 49, delete "FIGS." and insert therefor --FIGs.-- line 51, delete "the FIGS. is" and insert therefor --the FIGs. is--

Column 5:
line 16, add double dashes between numbers 3-3 as follows: delete "A line 3-3 drawn through" and insert therefor --A line 3--3 drawn through-- lines 18-19, add double dashes between numbers 4-4 as follows: delete "A line 4-4 drawn through" and insert therefor --A line 4--4 drawn through-- line 27, add double dashes between numbers 3-3 as follows: delete "along line 3-3 of FIG. 2." and insert therefor --along line 3--3 of FIG. 2.-- line 42, add double dashes between numbers 4-4 as follows: delete "along line 4-4 of FIG. 2." and insert therefor --along line 4--4 of FIG. 2.--

Signed and Sealed this  
Twelfth Day of June, 2012

David J. Kappos  
*Director of the United States Patent and Trademark Office*